(12) United States Patent
Reed et al.

(10) Patent No.: US 10,263,515 B2
(45) Date of Patent: Apr. 16, 2019

(54) QUASI-ANALOG DIGITAL PULSE-WIDTH MODULATION CONTROL

(71) Applicant: Licon Technology Corporation, Santa Clara, CA (US)

(72) Inventors: William Reed, Santa Clara, CA (US); Andrew Davis, Santa Clara, CA (US); Matthew Whitlock, Santa Clara, CA (US); Brent Dae Hermsmeier, Santa Clara, CA (US)

(73) Assignee: LICON TECHNOLOGY CORPORATION, Santa Clara, CA (US)

( * ) Notice: Subject to any disclaimer, the term of this patent is extended or adjusted under 35 U.S.C. 154(b) by 0 days.

(21) Appl. No.: 15/098,616

(22) Filed: Apr. 14, 2016

(65) Prior Publication Data
US 2017/0302170 A1    Oct. 19, 2017

(51) Int. Cl.
| H03K 7/08 | (2006.01) |
| H02M 3/156 | (2006.01) |
| H05B 33/08 | (2006.01) |
| H02M 1/00 | (2006.01) |

(52) U.S. Cl.
CPC ........ *H02M 3/156* (2013.01); *H05B 33/0815* (2013.01); *H02M 2001/0012* (2013.01); *H03K 7/08* (2013.01)

(58) Field of Classification Search
CPC ............. H03K 7/08; H02M 2001/0012; H05B 33/0839; H05B 33/0845; H05B 33/0815
See application file for complete search history.

(56) References Cited

U.S. PATENT DOCUMENTS

| 5,589,805 A * | 12/1996 | Zuraski | H03K 7/08 |
| | | | 318/599 |
| 6,765,422 B1 * | 7/2004 | Aslan | H02P 7/29 |
| | | | 327/124 |
| 7,391,630 B2 | 6/2008 | Acatrinei | |
| 8,203,320 B2 | 6/2012 | Leman et al. | |
| 9,699,842 B2 | 7/2017 | Allen, Jr. et al. | |

(Continued)

OTHER PUBLICATIONS

Notice of Allowance dated Feb. 24, 2017, in U.S. Appl. No. 15/098,613 in Allen et al. filed Apr. 14, 2016, pp. 1-8.

(Continued)

*Primary Examiner* — Harry R Behm
(74) *Attorney, Agent, or Firm* — Perkins Coie LLP

(57) ABSTRACT

A power supply for a smooth power output level transitioning includes an energy storage circuit for temporarily storing electric energy for driving a load, a semiconductor switch for pulse-width modulation (PWM) switching, and a digital PWM controller. The digital PWM controller generates a driving waveform to regulate on and off status of the semiconductor switch. The driving waveform toggles between PWM periods of a first type and PWM periods of a second type, and gradually adjusts a ratio of numbers of the PWM periods of the two types over time. The toggling driving waveform achieves one or more intermediate finer power output level that cannot be realized by a single type of PWM period with an intermediate duty cycle, due to the minimum item unit of the driving waveform limited by a clock rate of the digital PWM controller.

24 Claims, 12 Drawing Sheets

(56) References Cited

U.S. PATENT DOCUMENTS

| | | | | |
|---|---|---|---|---|
| 2006/0238231 A1* | 10/2006 | Mutaguchi | ............... | H03K 7/08 327/291 |
| 2008/0116871 A1* | 5/2008 | Li | ..................... | H02M 3/157 323/283 |
| 2010/0164922 A1* | 7/2010 | Nose | ................... | G09G 3/3406 345/207 |
| 2011/0193648 A1* | 8/2011 | Zhao | ..................... | H03K 7/08 332/109 |
| 2012/0075859 A1 | 3/2012 | Granado et al. | | |
| 2013/0307634 A1* | 11/2013 | Chin | ..................... | H03K 3/017 332/109 |
| 2014/0049231 A1* | 2/2014 | Takata | ................ | H02M 1/4225 323/207 |
| 2014/0253257 A1* | 9/2014 | Emoto | ................... | H03K 7/08 332/109 |
| 2017/0156185 A1* | 6/2017 | Zhou | ................ | H05B 33/0845 |

OTHER PUBLICATIONS

U.S. Appl. No. 15/641,155 of Allen Jr. et al. filed Jul. 3, 2017.

* cited by examiner

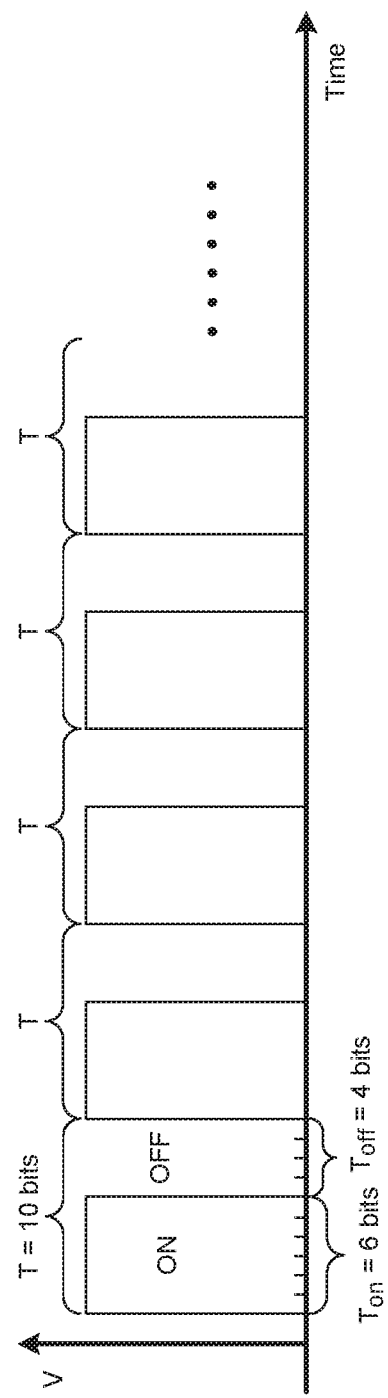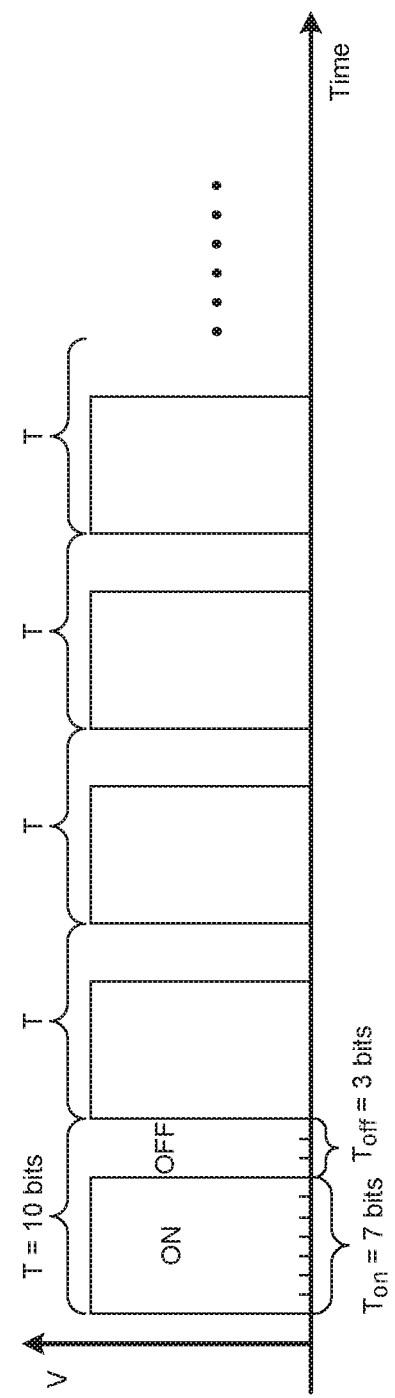

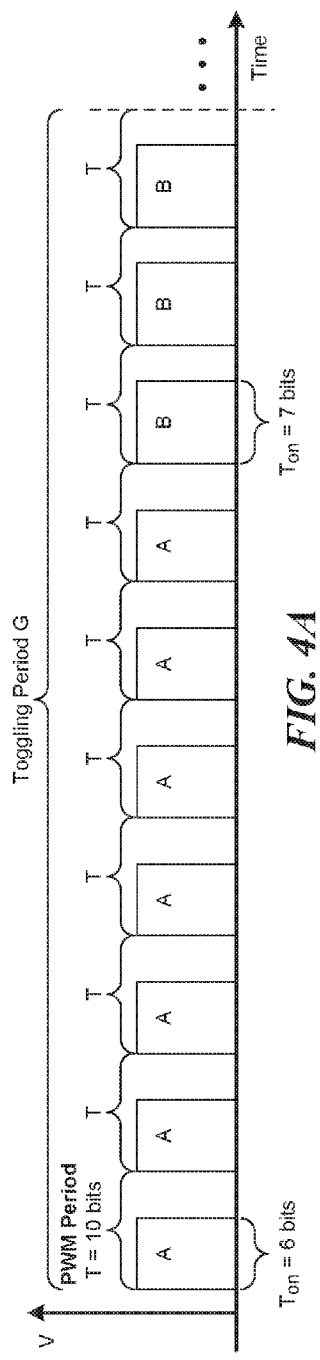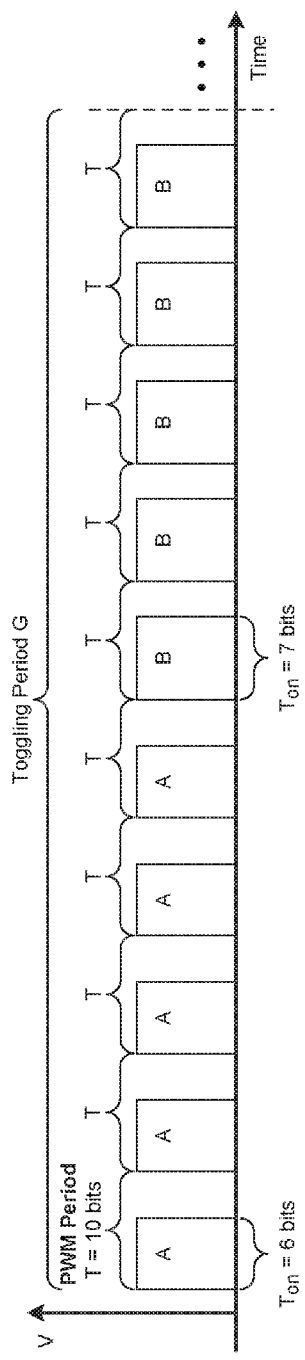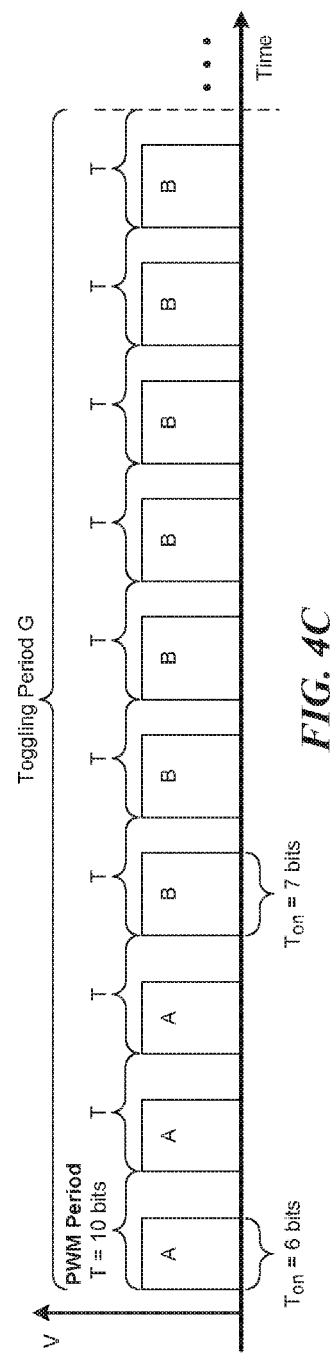

QUASI-ANALOG DIGITAL PULSE-WIDTH MODULATION CONTROL

BACKGROUND

An LED (light-emitting diode) light engine is a device including at least one LED module and an LED driver (also referred to as electronic control gear (ECG)). The LED light engines are widely used in various applications such as indicators, signs, luminaires, LCD (liquid crystal display) backlights, automobile headlights, medical devices, and optical communications.

One challenge for the LED lighting technology is to use dimming controller (also referred to as light controller) mechanism to control the light output level of the LED lighting. Pulse-width modulation (PWM) can be used for dimming the LED lighting. The PWM dimmer can include electronic circuitry that suppresses current flow for the LED lighting during defined portions of each cycle of the voltage waveforms. The brightness of light emitted by the LED lighting is adjusted by setting at what voltage (hence, what phase) in the half-cycle the dimmer begins to provide electric current to the LED lighting.

However, the pulses generated by conventional digital PWM light controllers have too large of step sizes for duty cycles. A digital processor of the digital PWM light controller generates waveforms with defined duty cycles. Due to the hardware limitation of the digital processor, the duty cycles can only change in discrete steps. When a light dimmer adjusts light intensity of the LED lighting using the conventional digital PWM light controller, the light intensity is dimmed in steps that are noticeable to human eyes, rather than decreases smoothly. The discrete steps in dimming light intensity are inherent in the conventional digital PWM light controller due to the processor limitation.

BRIEF DESCRIPTION OF THE DRAWINGS

One or more embodiments of the present invention are illustrated by way of example and not limitation in the figures of the accompanying drawings, in which like references indicate similar elements.

FIGS. 2A and 2B illustrate driving waveforms generated by the digital PWM controller using PWM periods of an individual duty cycle.

FIG. 4A, 4B and 4C illustrate toggling driving waveform for producing finer power output levels between two regular power output levels.

DETAILED DESCRIPTION

Figure 1:
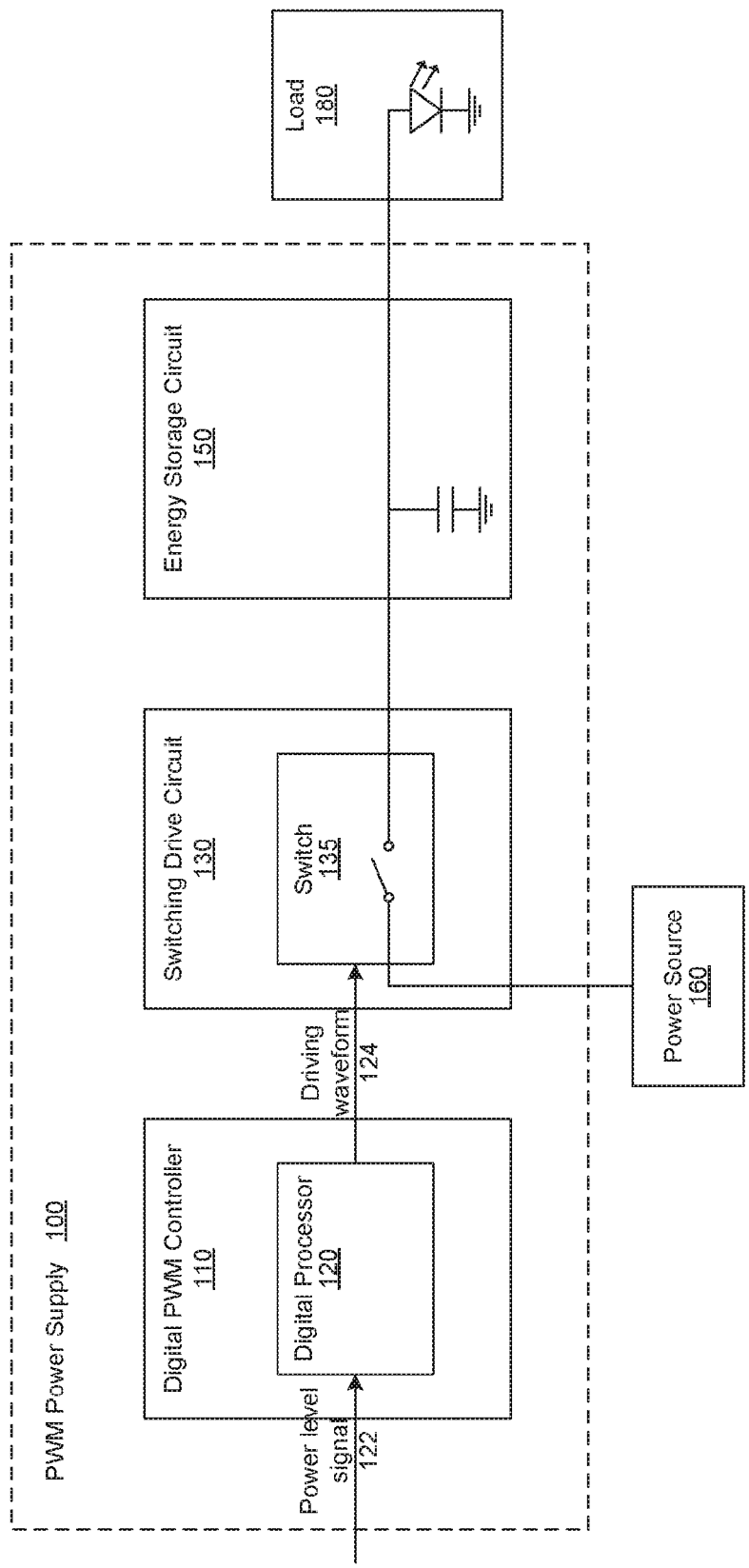
FIG. 1 illustrates a pulse-width modulation (PWM) power supply that provides adjustable energy output without noticeable discrete steps.

References in this description to "an embodiment", "one embodiment", or the like, mean that the particular feature, function, structure or characteristic being described is included in at least one embodiment of the present invention. Occurrences of such phrases in this specification do not necessarily all refer to the same embodiment. On the other hand, the embodiments referred to also are not necessarily mutually exclusive.

The conventional techniques limit the use of digital PWM controllers in low duty cycle regions. For example, if the nominal PWM pulse width is 100 bits (a bit being a time unit), then each 1-bit change is about 1% change in the energy transfer. If the nominal PWM pulse-width is 10 bits, each 1-bit change is about 10% change in the energy transfer. This is a fundamental limitation for conventional digital PWM controllers that operate over a range of energy transfer. If 1% change is required at the lowest energy setting for the conventional PWM controller to achieve transition, there is no choice for the conventional techniques except to increase the internal operating frequency of the PWM controller by 10 times. The higher internal operating frequency greatly increases internal power dissipation of the conventional PWM controller. In addition, feedback control loop design is more complex when integer changes to the duty cycle do not represent constant power changes over the entire operating range.

The technology disclosed herein provides a mechanism to minimize or eliminate the human-noticeable discrete steps in the dimming light intensity of the LED lighting. To mitigate the discrete steps of light intensity, a power supply of the technology regulates a PWM controller to rapidly toggle between two PWM digital steps. For example, if the digital steps spend 50% of the time at step n duty cycle and another 50% of the time at step n+1 duty cycle, the time averaged emitted power would be half way between the step n and the step n+1. Therefore, by varying the ratio of time between digital step n and digital step n+1 of duty cycles generated by the PWM controller, the power supply can realize a smooth transition of energy output between step n and step n+1.

In some embodiments of the technology, the power supply can include a digital PWM controller, a switching drive circuit and an energy storage circuit. The energy storage circuit can include a combination of various inductors and/or capacitors. The inductors and capacitors act to filter and store the energy pulses that flow through the switching circuit.

The design of the PWM switching frequency and energy storage circuit needs to be selected such that the switching frequency of the PWM switching circuit charges and discharges the energy storage circuits between two desired levels. The amount of dwell time between any two PWM duty cycle steps also needs to be short such that the average energy storage stays within the desired levels. Any combination of energy storage circuit time constants, PWM frequency, and dwell time between any PWM duty cycles can be used, provided that the final result is that the energy storage is within the desired amplitude and time constraints.

The power supply of the technology enables the digital PWM controller to run at a modest operating frequency while still allowing the energy storage step size to be both minimized as well as constant over a wide PWM duty cycle operating range. For example, the dwell times between any two PWM duty cycle points can be adjusted such that each change can be a fixed percentage. The method allows a minimization of digital PWM operating frequency while at the same time allowing constant energy step size. These two features greatly improve both the smooth transition of energy over a wide operating range of duty cycles, as well as simplify the feedback control loop design. This mechanism reduces the limitations of discrete digital PWM step sizes to the point that the system approaches the fine resolution that can be achieved by a linear analog PWM control system.

FIG. 1 illustrates a pulse-width modulation (PWM) power supply that provides adjustable energy output without noticeable discrete steps. The power supply 100 includes a digital PWM controller 110, a switching drive circuit 130 and an energy storage circuit 150. During operation, the energy storage circuit 150 temporarily stores electric energy for driving a load 180. The digital PWM controller 110 includes a digital processor 120. The switching drive circuit 130 includes a switch 135. The switch 135 can be a semiconductor switch, e.g., a power MOSFET (metal-oxide-semiconductor field-effect transistor) switch, a JFET (junction field-effect transistor) switch, or an IGBT (insulated-gate bipolar transistor) switch. The switch 135 turns on and off during pulse-width modulation (PWM) periods. During each PWM period, the switch 135 turns on once (during "on time" or "switch-on time" within the PWM period) and turn off once (during "off time" or "switch-off time" within the PWM period).

The digital processor 120 receives a power level signal (e.g., a dimming level signal) 122 and generates a driving waveform 124 based on the received power level signal 122. The power level signal can change over time. When the digital processor 120 receives a new power level signal 122, the processor 120 can generate a new driving waveform 124 based on the new power level signal 122.

The digital PWM controller 110 sends the driving waveform 124 to control the open and closed status of the switch 135 of the switching drive circuit 130 dynamically. The switching drive circuit receives electric energy from a power source 160. In some embodiments, the power source can be, e.g., an alternating-current (AC) electric power source such as the mains electricity supply (also referred to as household power, wall power, or grid power) at, e.g., 100V, 110V, 120V, 220V or 230V. The switch 135 toggles between the open state (also referred to as off state) and closed state (also referred to as on state) based on the driving waveform 124 sent from the digital PWM controller 110.

The switch 135 is electrically coupled between the energy storage circuit 150 and the electric power source 160. When the switch 135 is at the closed state, the electric energy supplied by the power source 160 can flow into the energy storage circuit 150 (in a form of electric current). When the switch 135 is at the open state, the energy storage circuit 150 cannot receive electric energy from the power source 160. The current flows within the energy storage circuit 150 and the load 180 (e.g., LED modules).

The energy storage circuit 150 includes non-linear components such as inductors and/or capacitors to temporarily store electric energy in forms of electric currents or electrostatic fields. The electric energy stored by the energy storage circuit 150 eventually is released to the load 180 for driving the load (e.g., driving the LED modules).

The digital PWM controller 110 can generate a driving waveform to regulate on and off status of the semiconductor switch. Some of the driving waveforms generated by the digital PWM controller 110 can toggle between PWM periods of a first type and PWM periods of a second type. The PWM periods of the first type having a first duty cycle different from a second duty cycle of the PWM periods of the second type.

The digital processor 120 of the digital PWM controller 110 operates at a clock rate that determines a minimum time unit for the driving waveform generated by the PWM controller. The driving waveform remains constant during each minimum time unit. In other words, the minimum time unit determines the resolution of the driving waveform; a driving waveform cannot contain a waveform signal that lasts for a fraction of the minimum time unit.

The duty cycles are different for the first and second PWM period types, because a difference between on time of the PWM periods of the first type and on time of the PWM periods of the second time is of an integer number of the minimum time unit. Alternatively, the duty cycles are different for the first and second PWM period types, because a difference between off time of the PWM periods of the first type and off time of the PWM periods of the second time is of an integer number of the minimum time unit. Furthermore, the duty cycles can be different because the PWM frequencies are different for the PWM periods of the first and second periods.

The digital PWM controller 110 is able to generate a driving waveform including just PWM periods of the first type, to cause the power supply device 100 produce a first power output level. Similarly, the digital PWM controller is able to generate a driving waveform including just PWM periods of the second type, to cause the power supply device produce a second power output level. The second power output level is different from the first power output level.

However, the power supply device may not be able to produce a third power output level simply by generating a driving waveform containing just PWM periods of a third type, where the PWM periods of the third type having a third duty cycle lower than the second duty cycle and higher than the first duty cycle. Due to a minimum time unit limited by the clock rate of the PWM controller, the digital PWM controller 110 may not be able to generate the PWM periods of the third type, e.g., if the PWM periods of the third type (with the third duty cycle) require a switch-on time or a switch-off time containing a fraction of the minimum time unit.

Instead, the digital PWM controller 110 according to the technology can generate a driving waveform that toggles between PWM periods of the first type and PWM periods of the second type. Such a toggling driving waveform causes the power supply device 100 to produce the third intermediate power output level. The time average of the duty cycles of the toggling driving waveform equals the third duty cycle value.

Using the driving waveform toggling between PWM periods of two different duty cycles, the power supply 100 can produce a finer power output level between the first and second power output levels. The digital PWM controller 120 can further gradually adjusts a ratio of a number of the PWM periods of the first type to a number of the PWM periods of the second type over time. This ratio adjustment results in a time series of finer power output levels that are between the first and second power output levels. As a result, the power supply device can transition smoothly between the first and second power output levels through the time series of the finer power output levels.

In some embodiments, there are multiple regular power output levels between the initial and final power output levels; each regular power output level can be achieved by simply using PWM periods of an individual duty cycle being generated by the digital PWM controller 110. However, the number of the intermediate regular power output levels is not large enough to enable a smooth transition. These intermediate regular power output levels are still sensed as discrete levels. In order to further guarantee a smooth power output transition, the digital PWM controller 110 can use multiple toggling driving waveforms to fill in the gaps with finer power output levels.

In other words, for each two neighboring regular power output levels, the digital PWM controller 110 generate a driving waveform that toggles between PWM periods corresponding to these two neighboring regular power output levels and gradually adjusts the PWM period ratio over time. The result is a time series of toggling driving waveforms that provide a large number of finer power output levels, so that the power supply 100 transitions smoothly from the initial level to the final level through a large number of finer power output levels.

FIG. 2A illustrates a driving waveform generated by the digital PWM controller. In one embodiment, for example, the PWM power supply 100 can include an inexpensive 16 MHz clocked digital PWM controller 110. Since the digital PWM controller 110 and its digital processor 120 operate at 16 MHz, the finest waveform resolution that the digital PWM controller 110 can achieve (i.e., minimum time unit) is $6.25*10^{-8}$ second (=$\frac{1}{16,000,000}$). The time period of the finest wave form resolution is defined as 1 bit (1 bit=$6.25*10^{-8}$ second). In other words, one bit represents one minimum time unit of the driving waveform.

The driving waveform illustrated in FIG. 2A has a repeating PWM period of 10 bits (T=10 bits). Within each PWM period T, the PWM controller turns on the switch 135 for 6 bits (on period $T_{on}$=6 bits, also referred to as dwell time or switch-on time). Then the PWM controller turns off the switch 135 for 4 bits (off period $T_{off}$=4 bits, also referred to as switch-off time). The duty cycle D is defined as the percentage of the time period when the switch 135 is turned on. $D=T_{on}/T=6/10=60\%$. The PWM controller is set to output at a width of 6 PWM bits for each on period and the output power of the power supply was measured as 10.00 Watts.

When the digital PWM controller 110 receives a different power level signal 122, the digital PWM controller 110 adjusts the driving waveform 124 accordingly. For example, the digital PWM controller 110 receives a power level signal 122 for a higher power level output. FIG. 2B illustrates a new driving waveform generated by the digital PWM controller for a higher power level output.

The driving waveform illustrated in FIG. 2B has the same PWM period of 10 bits (T=10 bits). Within each PWM period T, the PWM controller turns on the switch 135 for 7 bits (on period $T_{on}$=7 bits, dwell time). Then the PWM controller turns off the switch 135 for 3 bits (off period $T_{off}$=3 bits). The duty cycle D is defined as the percentage of the time period when the switch 135 is turned on. $D=T_{on}/T=7/10=70\%$. The PWM controller is set to output at a width of 7 PWM bits for each on period and the output power of the power supply was measured as 11.67 Watts.

As shown in FIGS. 2A and 2B, the PWM power supply can adjust the dwell time (and hence adjust the duty cycle) to regulate the output power. However, due to the digital nature of the 16 MHz digital PWM controller 110, the finest waveform resolution that the digital PWM controller 110 can achieve is 1 bit ($6.25*10^{-8}$ second). In other words, the digital PWM controller 110 can set the dwell time as 6 bits and the duty cycle as 60%, as illustrated in FIG. 2A; the digital PWM controller 110 can also set the dwell time as 7 bits and the duty cycle as 70%. However, the digital PWM controller 110 cannot set the dwell time as 6.5 bits and duty cycle as 65%.

Such discrete steps of duty cycles cause discrete steps of power output noticeable by humans. For example, the digital PWM controller 110 can receive a power level signal 122 instructing the output level to gradually increase from 10.00 Watts to 15.00 Watts. The digital PWM controller 110 can first generate a driving waveform similar to the one illustrated in FIG. 2A, with a dwell time of 6 bits and a duty cycle of 60%. The instant power output is 10.00 Watts. Then the digital PWM controller 110 generate a driving wave similar to the one illustrates in FIG. 2B, with a dwell time of 7 bits and a duty cycle of 70%. The instant power output is 11.67 Watts.

The digital PWM controller 110 further generates a driving waveform with a dwell time of 8 bits and a duty cycle of 80%. The instant power output is 13.33 Watts. Finally, the digital PWM controller 110 generates a driving waveform with a dwell time of 9 bits and a duty cycle of 90%. The instant power output is 15.00 Watts. These power output levels, which can be achieved by simply adjusting the dwell time or duty cycle within the PWM period, are called regular power output levels. In other words, for producing each regular power output level, the PWM controller needs only PWM periods of an individual duty cycle.

Figure 3:
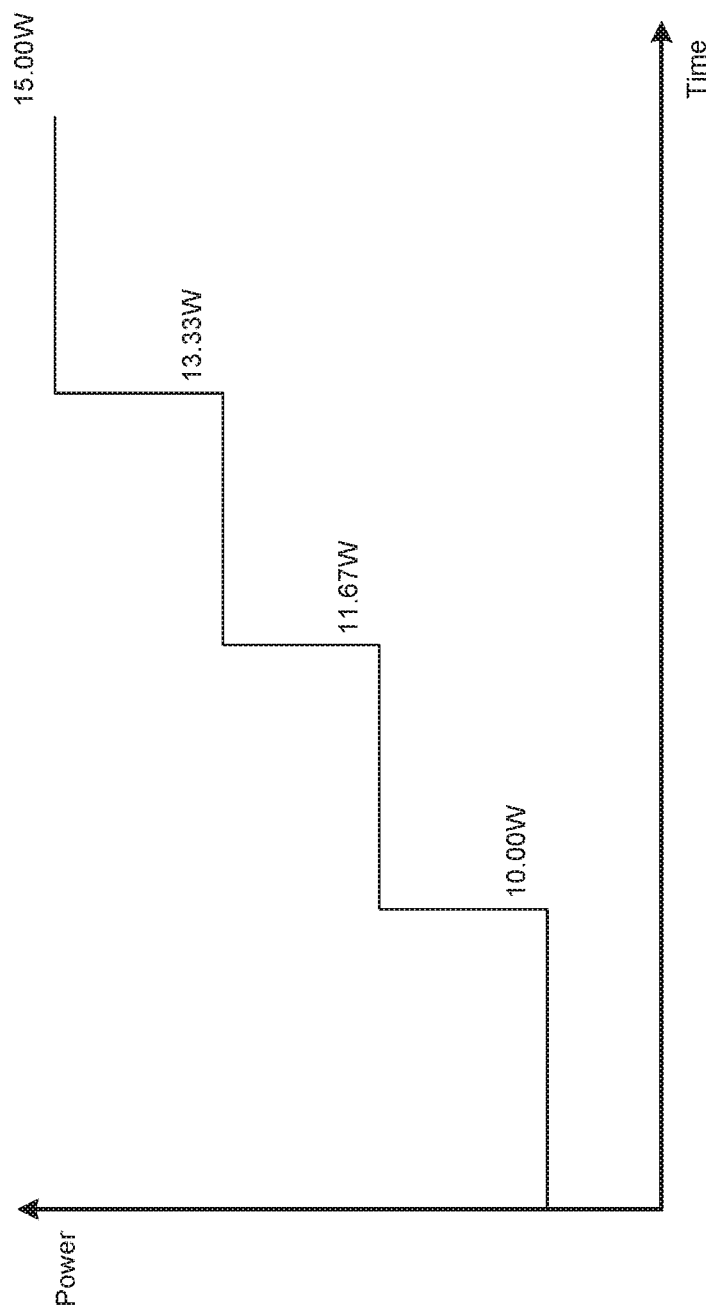
FIG. 3 illustrates the power output curve over time with noticeable discrete power levels.

Therefore, the power supply adjusts the dwell times and duty cycles of the driving waveforms to adjust the regular power levels from 10.00 Watts, 11.67 Watts, 13.33 Watts to 15.00 Watts. FIG. 3 illustrates the power output curve over time with noticeable discrete power levels. In some embodiments, the power output levels correspond to, e.g., the light intensity of light emitted by one or more LED modules. A human eye can notice the discrete power levels changing form 10.00 Watts, 11.67 Watts, 13.33 Watts to 15.00 Watts. It is desirable to have power levels with finer steps and smaller step gaps, in order to present a smooth transition from 10.00 Watts to 15.00 Watts similar to what analog dimmer systems show.

In order to realize finer power output levels (e.g., power output levels between 10.0 Watts and 11.67 Watts), the PWM power supply 110 generates a driving waveform to rapidly toggle between two PWM digital steps (thus output finer power output levels between regular power output levels). FIG. 4A illustrates a driving waveform for a finer power output level between two power output levels. As shown in FIGS. 2A and 2B, the digital PWM controller 110 cannot generate a driving waveform having a dwell time between 6 bits and 7 bits, in order to produce a finer power output level between 10.0 Watts and 11.67 Watts.

Instead, the driving waveform illustrated in FIG. 4A first includes seven PWM periods (T=10 bits), each PWM period includes a dwell time (on period) of 6 bits ($T_{on}$=6 bits). These seven peaks of 6 bits are designated as peaks type "A" in FIG. 4A. Following the seven PWM periods of peaks A, the driving waveform includes three PWM periods (again T=10 bits), each PWM period includes a dwell time (on period) of 7 bits ($T_{on}$=7 bits). These three peaks of 7 bits are designated as peak type "B" in FIG. 4A. These 10 PWM periods, including the 7 PWM periods of peaks A ("A period") and the 3 PWM periods of peaks B ("B period"), form a "toggling period" (G) including 10 PWM periods (10*10=100 bits). Note that one toggling period includes multiple PWM periods; each PWM period includes only one peak. Then the driving waveform repeats the pattern of the toggling period for a certain time period. The duty cycle for the first 7 A periods is 60% (D=6/10=60%). The duty cycle for the next 3 B periods is 70%. The time average duty cycle of the whole toggling period is 63% ($D_T$=70%*60%+ 30%*70%=63%). Because the duty cycle determines when the power supply outputs at a level of 10.0 Watts and when the power supply outputs at a level of 11.7 Watts. The time average of the power output for a toggling period is 10.5 Watts ($P_T$=70%*10.0W+30%*11.67W=10.50W).

FIG. 4B illustrates another driving waveform for another finer power output level between two power output levels. The toggling period of the driving waveform of FIG. 4B includes 10 PWM periods, just like the driving waveform of FIG. 4A. The toggling period in FIG. 4B includes 5 A periods (dwell time of 6 bits) and 5 B periods (dwell time of 7 bits). The time average duty cycle for the toggling period is 65% ($D_T$=50%*60%+50%*70%=65%). The time average power output for the toggling period is 10.8 Watts ($P_T$=50%*10.0 W+50%*11.67 W=10.83 W).

Similarly, FIG. 4C illustrates a driving waveform for yet another finer power output level between two power output levels. The toggling period of the driving waveform of FIG. 4C includes 10 PWM periods. The toggling period in FIG. 4A includes 3 A periods (dwell time of 6 bits) and 7 B periods (dwell time of 7 bits). The time average duty cycle for the toggling period is 67% ($D_T$=30%*60%+ 70%*70%=67%). The time average power output for the toggling period is 11.17 Watts ($P_T$=30%*10.0 W+70%*11.67 W=11.17 W).

As FIGS. 4A, 4B and 4C show, the PWM power supply can produce finer power output levels by adjust the percentage distribution of PWM periods for two regular power output levels. For example, the PWM power supply can produce two regular power output levels of 10.0 Watts and 11.67 Watts, using A type PWM periods with dwell time of 6 bits and B type PWM period with dwell time of 7 bits respectively. The PWM power supply can further produce a power output level of 10.50 Watts, using a driving waveform of FIG. 4A with a toggling period having 70% of A type PWM periods (dwell time of 6 bits) and 30% of B type PWM periods (dwell time of 7 bits). If the toggling period includes 50% of A type PWM periods and 50% of B type PWM periods as illustrated in FIG. 4B, the PWM power supply produces a power output level of 10.83 Watts. If the toggling period includes 30% of A type PWM periods and 70% of B type PWM periods as illustrated in FIG. 4C, the PWM power supply produces a power output level of 11.17 Watts.

Figure 5:
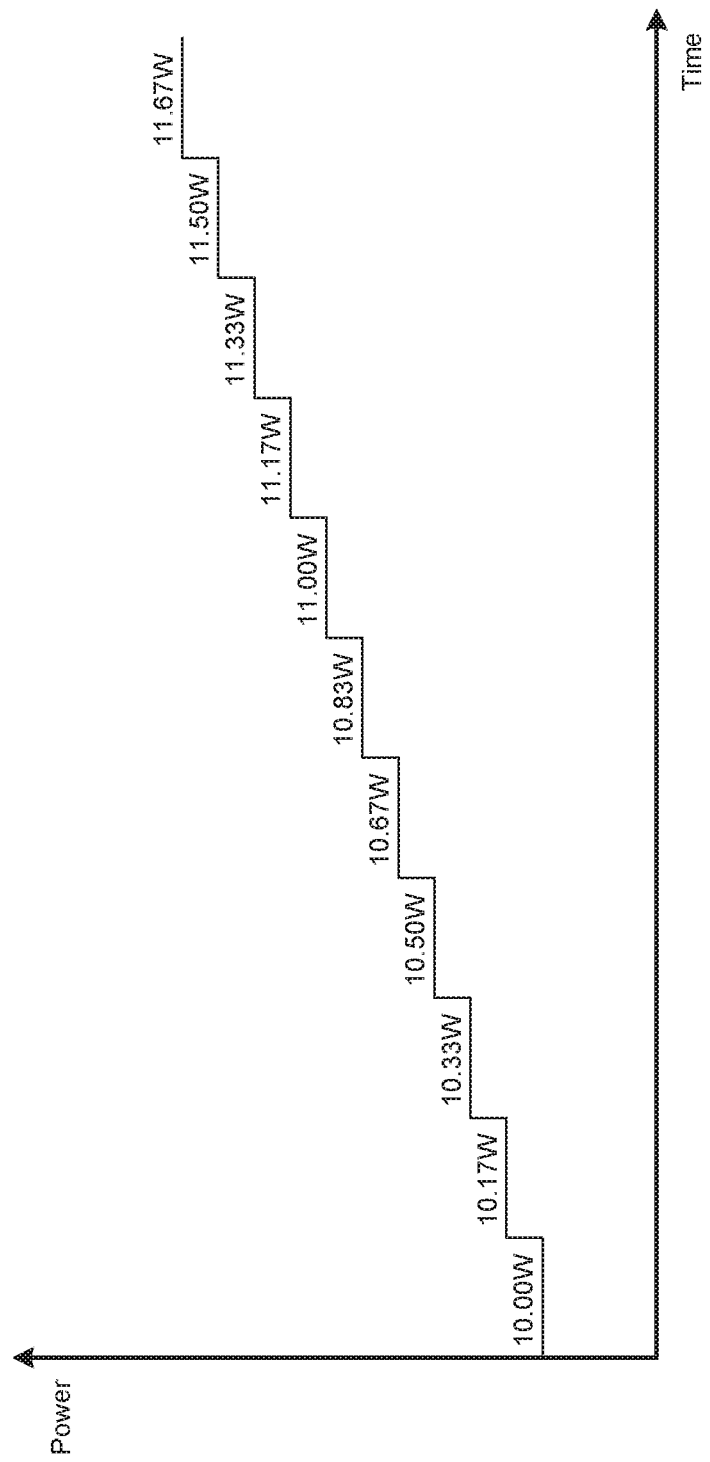
FIG. 5 illustrates a power output curve over time with finer power output levels between two regular power output levels.

Therefore, the power supply can produce finer power output levels between regular power output levels, by adjusting the percentage distribution of PWM periods in the toggling period. For example, if the power supply changes a percentage of A periods by 10% each time, the power supply can gradually moves from one regular power output level to another regular power output level through 10 finer power output levels. FIG. 5 illustrates a power output curve over time with finer power output levels between two regular power output levels. In order to gradually move from 10.0 W to 11.7 W, the power supply adjusts the percentage of A periods (dwell time of 6 bits) by 10% each time. As a result, the power supply produces finer power output levels of 10.17, 10.33, 10.50, 10.67, 10.83, 11.00, 11.17, 11.33, 11.50 Watts over time.

Referring back to FIG. 3, if the power supply only adjusts the duty cycles within each PWM period, the power supply moves from 10.00 W to 15.00 W through only four discrete power output levels of 10.00 W, 11.67 W, 13.33 W and 15.00 W. By toggling between two regular power output levels and adjusting the percentage of periods in the toggling period, now the power supply can moves form 10.00 W to 15.00 W through finer power output levels.

The conventional techniques would result a large step gap of 1.67 Watt of energy output as shown in FIG. 3. The power supply of the disclosed technology varies the dwell time in 10% increments, and achieves step changes of only 0.17 Watt as shown in FIG. 5. Therefore, the disclosed technology achieves a smaller step change that would require a digital PWM controller of 160 MHz clock under conventional techniques. The PWM controller with higher clock frequency is more expensive and requires a more complex feedback control loop circuit design. The step change can be further reduced, if the power supply of the disclosed technology varies the dwell time in increments smaller than 10%.

Figure 6:
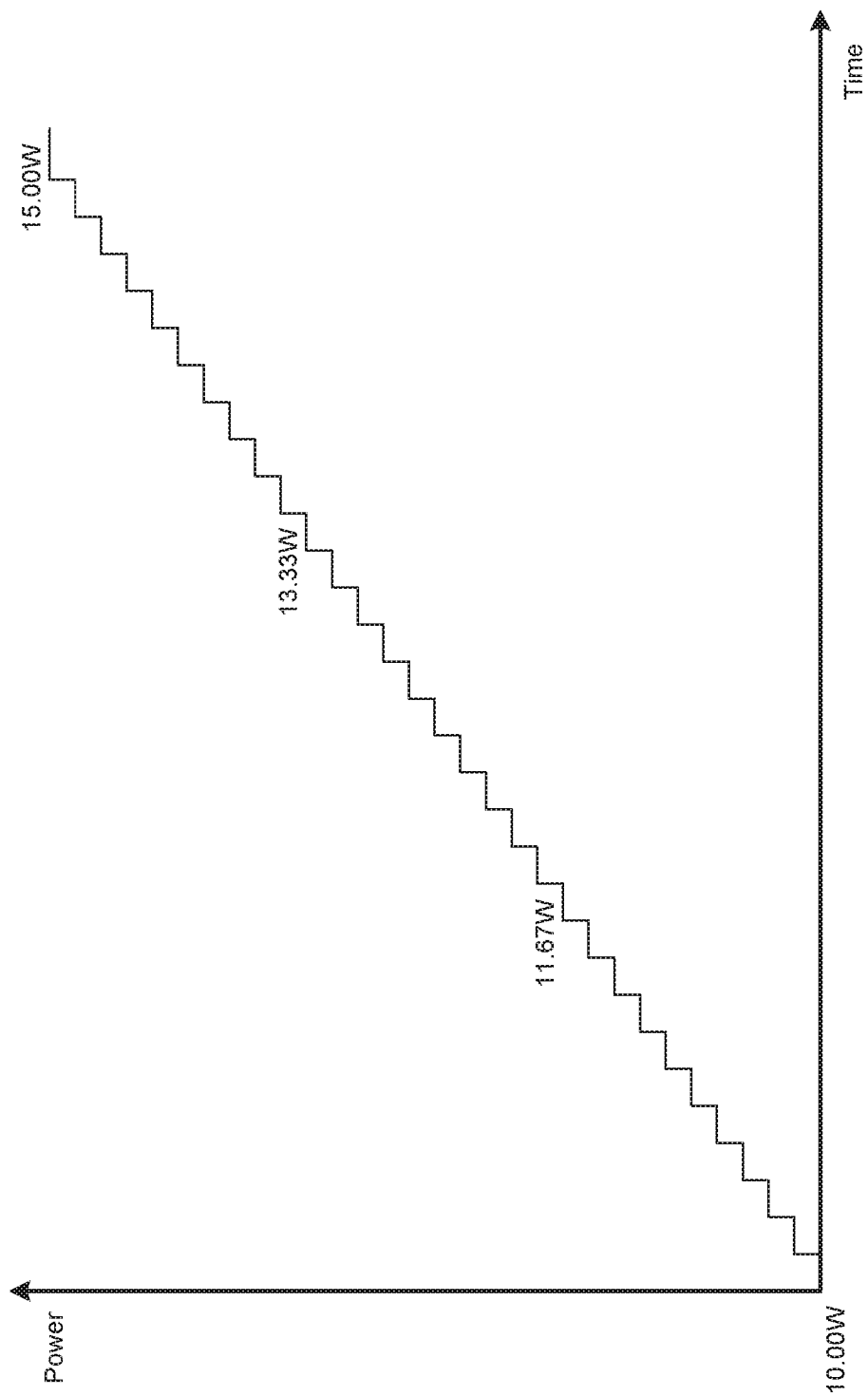
FIG. 6 illustrates a power output curve over time with finer power output levels across multiple regular power output levels.

FIG. 6 illustrates the power output curve over time with finer power output levels, across multiple regular power output level. By toggling between PWM periods with dwell time of 6 bits and 7 bits and adjusting the percentage of PWM periods by an increment of 10%, the power supply moves from regular power output level of 10.00 W to 11.67 W through 10 finer power output levels. Similarly, by toggling between PWM periods with dwell time of 7 bits and 8 bits and adjusting the percentage of PWM periods by an increment of 10%, the power supply moves from regular power output level of 11.67 W to 13.33 W through 10 finer power output levels. Furthermore, by toggling between PWM periods with dwell time of 8 bits and 9 bits and adjusting the percentage of PWM periods by an increment of 10%, the power supply moves from regular power output level of 13.33 W to 15.00 W through 10 finer power output levels.

Therefore, now the power supply's power output level moves from 10.00 W to 15.00 W through 30 finer power output levels. The gap between neighboring finer power output levels is only 0.17 Watts. If the power supply gradually produces the 30 finer power output levels to drive an LED module, a human eye perceives a smooth transition of light intensity. The visual effect of the smooth transition appears the same of a conventional light source controlled by an analog dimmer system.

Although FIGS. 5 and 6 show finer power output levels by adjusting the percentage of types of PWM periods by an increment of 10%, a person having ordinary skill in the art readily appreciates that the power supply can adjust the percentage distribution of types of PWM periods in an arbitrary manner. For example, the power supply can adjust the percentage change by an increment of 1%, or in a non-linear manner. Furthermore, the power supply can toggle between more than two types of PWM periods with more than two different dwell times. For example, a toggling period in the driving waveform can includes three types of PWM periods, e.g., PWM periods with dwell times (on time $T_{on}$) of 6 bits, 7 bits and 8 bits.

FIGS. 4A, 4B, 4C show that by toggling between two types of PWM periods with two different dwell times (also referred to as on periods); the power supply can produce finer power output levels between regular power output levels. FIG. 5 shows that by adjusting the percentage of the two types of PWM periods with two different dwell times, the power supply's power output levels can achieve a smooth transition between two regular power output levels through multiple finer power output levels. In some embodiments of the technology, instead of toggling between two types of PWM periods with two different dwell times (with the same amount of PWM periods), the power supply can toggle between two types of PWM periods with different amount of PWM time periods (regardless of whether the dwell times are the same or not).

In other words, in order to achieve finer power output levels, the power supply can change the PWM frequency rather than change the dwell time. These two methods achieve the same effects: adjusting the time average of duty cycle and in turn adjusting the time average of power output.

Figure 7A:
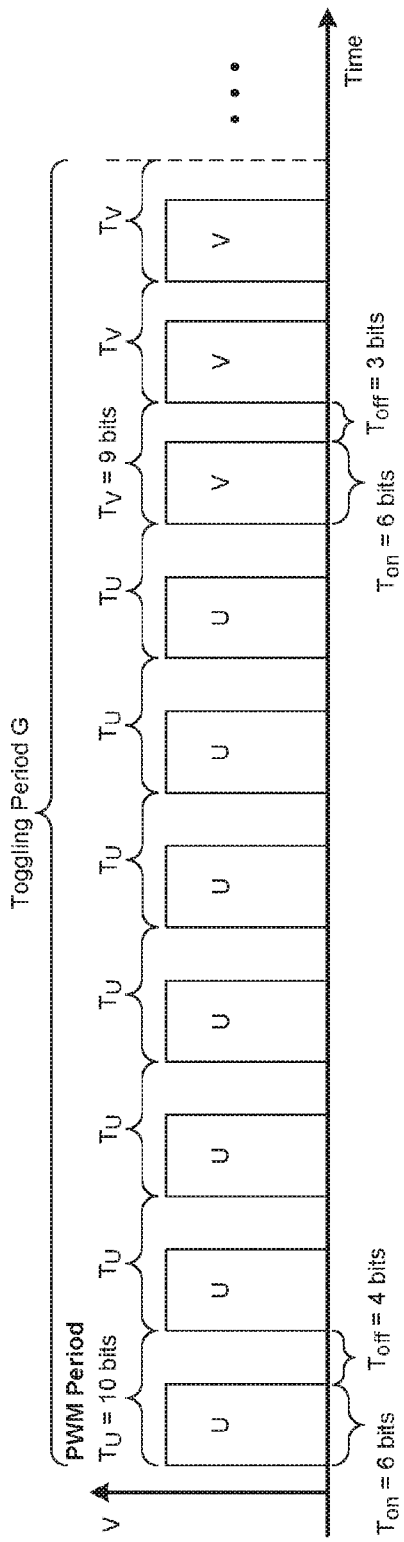
FIGS. 7A, 7B, 7C and 7D illustrate driving waveforms for achieving finer power output levels by adjusting PWM frequencies.

FIG. 7A illustrates a driving waveform for achieving a finer power output level by adjusting PWM frequencies. The driving waveform illustrated in FIG. 7A first includes seven U type PWM periods having a PWM period time duration of 10 bits (T=10 bits). Each of the seven U type PWM periods has a "U" peak of dwell time (on period) of 6 bits and an off period of 4 bits. Following the seven U type PWM periods, the driving waveform includes three V type PWM periods having a different PWM period time duration of 9 bits (T=9 bits). Each of the three V type PWM periods has a "V" peak of dwell time (on period) of 6 bits and an off period of 3 bits.

These 10 PWM periods, including the 7 U type PWM periods and the 3 V type PWM periods, form a toggling period (G) including 10 PWM periods (each PWM period includes one peak). The total time duration of the toggling period G is 97 bits ($T_G=7*10+3*9=97$ bits). The time average duty cycle of the whole toggling period is 61.86% ($D_T=6*10/97=61.86\%$). The time average of the power output for the toggling period is 10.31 Watts ($P_T=10.0$ W/60%*61.86%=10.31 W).

Figure 7B:
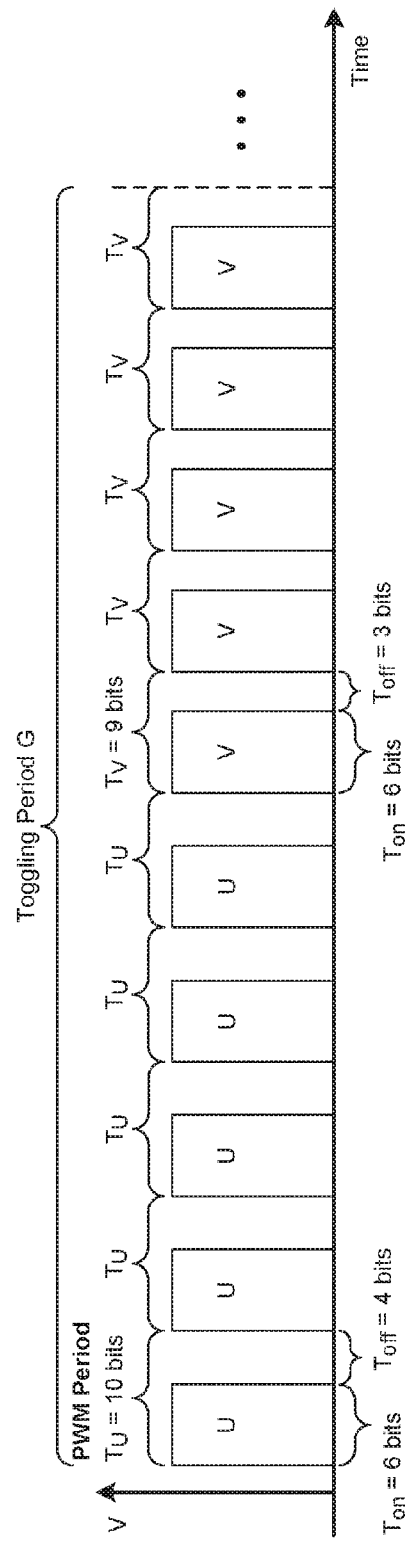

FIG. 7B illustrates another driving waveform for another finer power output level between two power output levels. The toggling period of the driving waveform of FIG. 7B includes 10 PWM periods, just like the driving waveform of FIG. 7B. The toggling period in FIG. 7B includes 5 type U PWM periods ($T_{on}=6$ bits; $T_{off}=4$ bits) and 5 type V PWM periods ($T_{on}=6$ bits; $T_{off}=3$ bits). The total time duration of the toggling period G is 95 bits ($T_G=5*10+5*9=95$ bits). The time average duty cycle of the whole toggling period is 61.86% ($D_T=610/95=63.16\%$). The time average of the power output for the toggling period is 10.53 Watts ($P_T=10.0$ W/60%*63.16%=10.53 W).

Figure 7C:
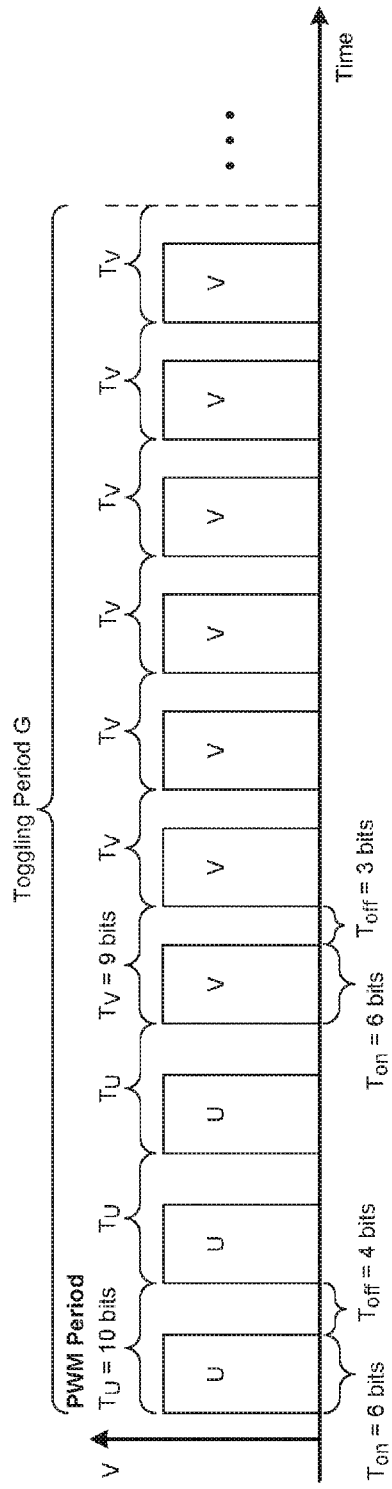

Similarly, FIG. 7C illustrates a driving waveform for yet another finer power output level between two power output levels. The toggling period of the driving waveform of FIG. 7C includes 10 PWM periods. The toggling period in FIG. 7C includes 3 type U PWM periods ($T_{on}=6$ bits; $T_{off}=4$ bits) and 7 type V PWM periods ($T_{on}=6$ bits; $T_{off}=3$ bits). The total time duration of the toggling period G is 95 bits ($T_G=3*10+7*9=93$ bits). The time average duty cycle of the whole toggling period is 64.52% ($D_T=610/93=64.52\%$). The time average of the power output for the toggling period is 10.75 Watts ($P_T=10.0$ W/60%*63.16%=10.75 W).

Figure 7D:
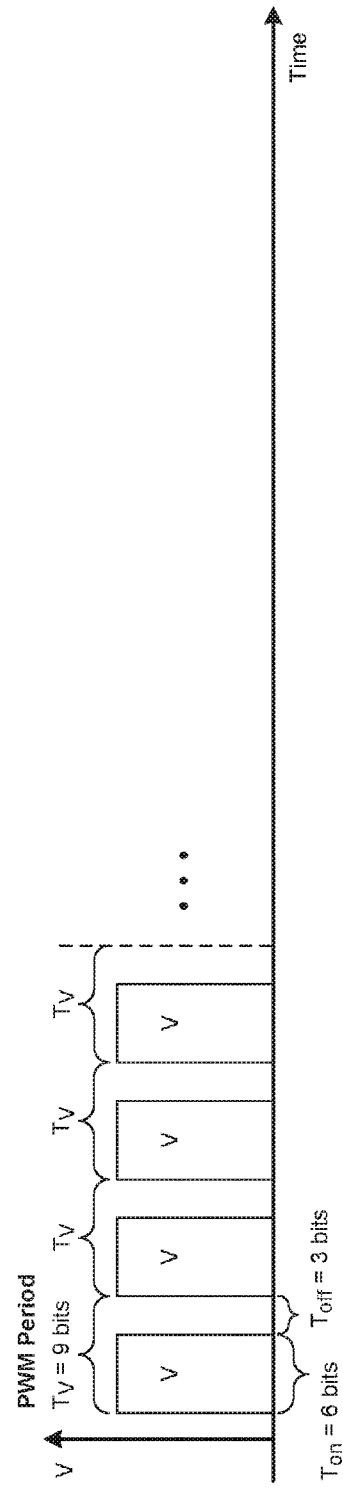

FIG. 7D illustrates a driving waveform including just type V PWM periods. All type V PWM periods in the driving waveform has on period of 6 bits and off period of 3 bits. The duty cycle is 66.67% (D=6/9=66.67%). The power output is 11.11 Watts (P=10.0 W/60%*66.67%=11.11 W).

Thus, just by generating driving waveform containing 10-bit PWM periods with 6-bit dwell time, the power supply can produce a power output of 10.00 W. Then just by generating driving waveform containing 9-bit PWM periods with 6-bit dwell time, (note the different PWM frequency), the power supply can produce a power output of 11.11 W. In order to produce finer power output levels such as 10.31 Watts, 10.53 Watts and 10.75 Watts, the power supply can toggle between the 10-bit PWM periods and 9-bit PWM periods, as illustrated in FIGS. 7A, 7B and 7C.

Figure 8:
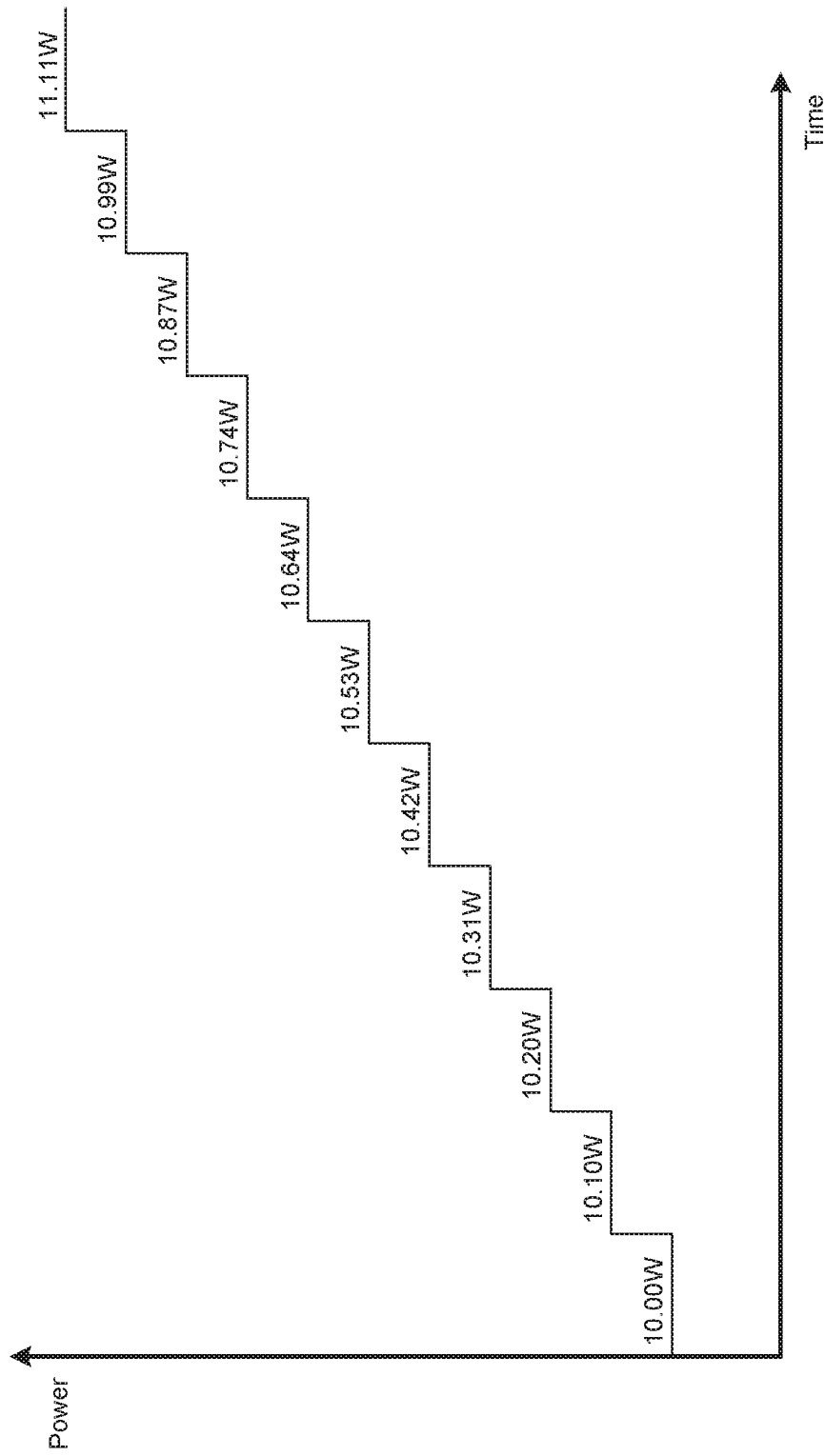
FIG. 8 illustrates a power output curve over time with finer power output levels between two power output levels when the power supply toggles between PWM periods with different frequencies.

In order to gradually produce 10 finer power output steps between 10.00 W and 11.11 W, the power supply can start with the driving waveform with all 10-bit PWM periods (e.g., the waveform illustrated in FIG. 2A). Then the power supply define a toggling period as 10 PWM periods, and replace one 10-bit type U PWM period from the toggling period with a 9-bit type V PWM period for each finer power output step. As a result, the power supply can gradually moves from power output level of 10.00 W to another power output level of 11.11 W through 10 finer power output levels. FIG. 8 illustrates a power output curve over time with finer power output levels between two power output levels when the power supply toggles between PWM periods with different frequencies. The power supply produces finer power output levels of 10.10 W, 10.20 W, 10.31 W, 10.42 W, 10.53 W, 10.64 W, 10.74 W, 10.87 W, 10.99 W and 11.11 W over time.

FIGS. 4A, 4B, 4C, 5 and 6 show that the power supply can produce finer power output levels by toggling between different types of PWM periods with different dwell times (also referred to as on periods), to achieve a smooth transition between power output levels. FIGS. 7A, 7B, 7C, 7D and 8 show that the power supply can also produce finer power output levels by toggling between different types of PWM periods with different PWM period time durations (hence different PWM frequencies), to achieve a smooth transition between power output levels. Furthermore, the power supply can produce finer power output levels by toggling between different types of PWM periods with different switch-on times (or switch-off times) as well as different PWM period time durations (hence different PWM frequencies).

Figure 9:
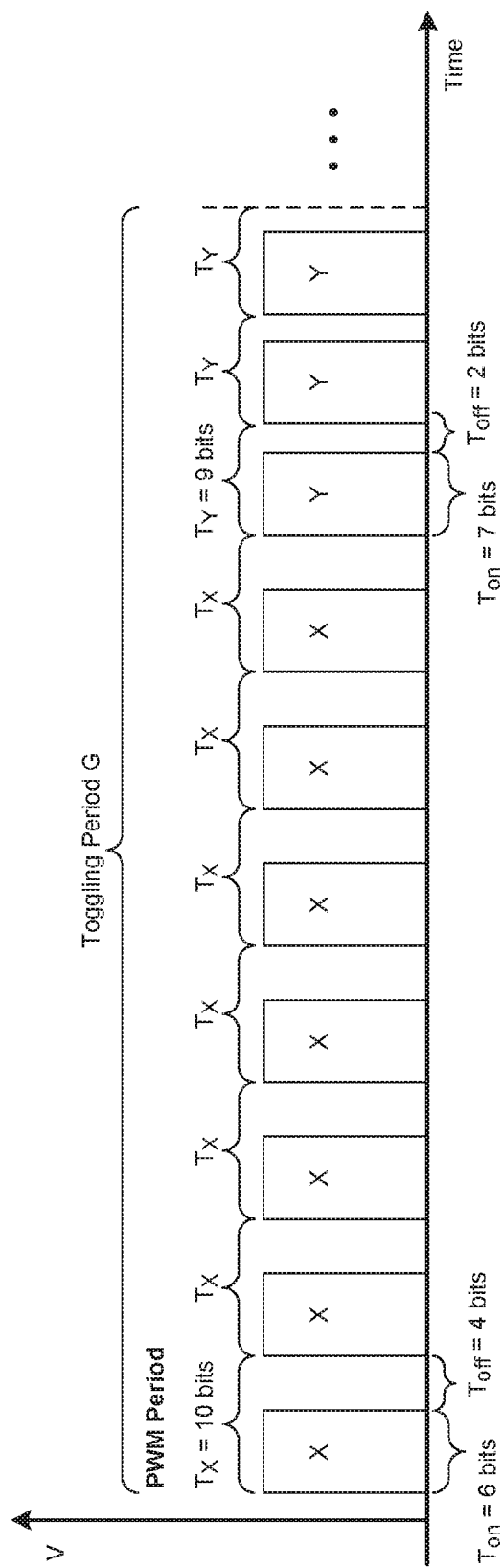
FIG. 9 illustrates a driving waveform for achieving a finer power output level by adjusting PWM frequencies as well as switch-on times.

For example, FIG. 9 illustrates a driving waveform for achieving a finer power output level by adjusting PWM frequencies as well as switch-on times. The driving waveform illustrated in FIG. 9 first includes seven X type PWM periods having a PWM period time duration of 10 bits (T=10 bits), each the seven X type PWM periods has a "X" peak of switch-on time of 6 bits and an off period of 4 bits. Following the seven X type PWM periods, the driving waveform includes three Y type PWM periods having a different PWM period time duration of 9 bits (T=9 bits). Each of the three Y type PWM periods has a "Y" peak of switch-on time of 7 bits and an off period of 2 bits. These 10 PWM periods form a toggling period; the driving waveform repeats the pattern of the toggling period.

The total time duration of the toggling period is 97 bits ($T_G=7*10+3*9=97$ bits). The duty cycle of the toggling period is 64.95% ($D_G=(7*6+3*7)/97=64.95\%$). The time average power output of the toggling period is 10.82 W ($P_G=10.00$ W/60%*64.95%=10.82 W).

Thus, the X type PWM periods and the Y type PWM periods having different switch-on times as well as different PWM period time duration (hence different PWM frequencies). As far as the power supply's driving waveform toggles between different types of PWM periods with different duty cycles, the power supply is able to produce finer power output levels for achieving a smoother power output transition.

Figure 10:
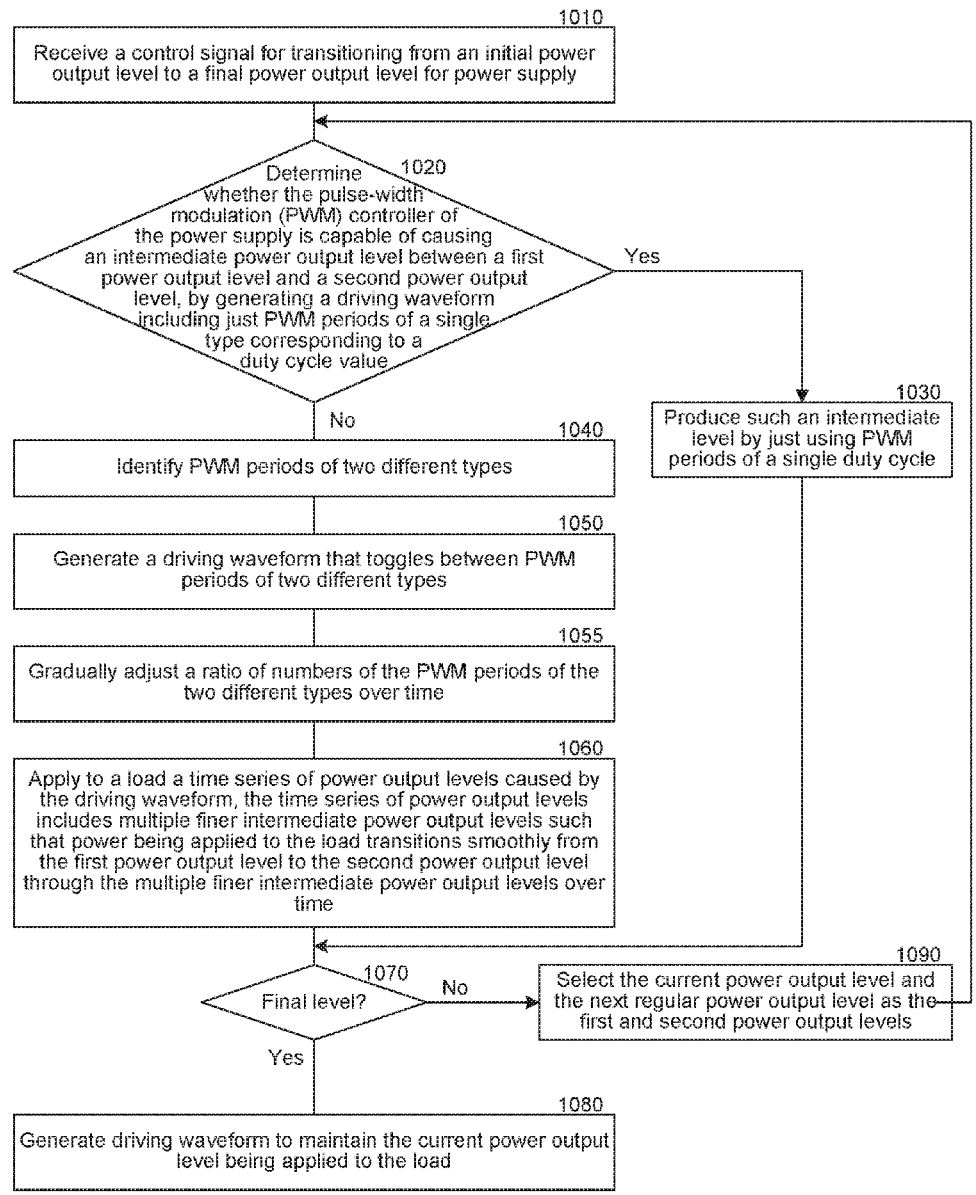
FIG. 10 illustrates a process of a smooth transitioning of power output levels.

FIG. 10 illustrates a process of a smooth transitioning of power output levels. Although some embodiments disclosed herein disclose that the smooth transitioning process can be applied to solid-state lighting systems (e.g., LED modules), the smooth transitioning technology of power output levels can be applied to other system as well, e.g., electric motors, gas-discharge lighting systems, servo control systems, telecommunication signal modulation, audio amplification, power converters, electrical fans, electrical kitchen appliances, etc.

At step 1010 of the process, a receiver of the power supply receives a control signal for transitioning from an initial power output level to a final power output level for power supply. At step 1020, the power supply determines whether the pulse-width modulation (PWM) controller of the power supply is capable of causing an intermediate power output level between a first power output level and a second power output level, by generating a driving waveform including just PWM periods of a single type corresponding to a duty cycle value. The minimum time unit of PWM period and driving waveform is limited by a clock rate of the PWM controller. If the PWM periods with that duty cycle value require that the PWM controller generates the PWM periods with a switch-on time or a switch-off time that lasts for a non-integer number of minimum time unit, the power supply determines it cannot produce such an intermediate level by just using PWM periods of a single duty cycle.

If the power supply determines that the PWM controller is capable of doing so, at step 1030, the power supply just produce such an intermediate level by just using PWM periods of a single duty cycle. Otherwise, at step 1040, the power supply identifies PWM periods of two different types. The PWM periods of the two different types can have two different switch-on times, or switch-off times, or PWM period time durations that last for integer numbers of minimum time units that are limited by a clock rate of the PWM controller.

At step 1050, the digital PWM controller generates a driving waveform that toggles between PWM periods of two different types. At step 1055, the digital PWM controller gradually adjusts a ratio of numbers of the PWM periods of the two different types over time. As a result of the driving waveform, a time average value of duty cycles of the PWM periods within a portion of driving waveform is between duty cycles of the PWM periods of the two different types. Thus, the time average value of the duty cycles of the portion of the driving waveform cause a power output level applied to the load to be a middle level between the first and second power output level.

At step 1060, the power supply applies to a load a time series of power output levels caused by the driving waveform, the time series of power output levels includes multiple finer intermediate power output levels such that power being applied to the load transitions smoothly from the first power output level to the second power output level through the multiple finer intermediate power output levels over time.

At step 1070, the power supply determines whether a final power output level is reached. If so, at step 1080, the power supply generates driving waveform to maintain the current power output level being applied to the load. Otherwise, at step 1090, the power supply selects the current power output level and the next regular power output level as the first and second power output levels, goes back to step 1020 to repeat the steps 1020-1060.

The steps described in FIG. 10 can be performed by, e.g., a system illustrated in FIG. 1 (power supply 100). The steps described in FIG. 10 need not be performed in the order recited and two or more steps can be performed in parallel or combined.

Figure 11:
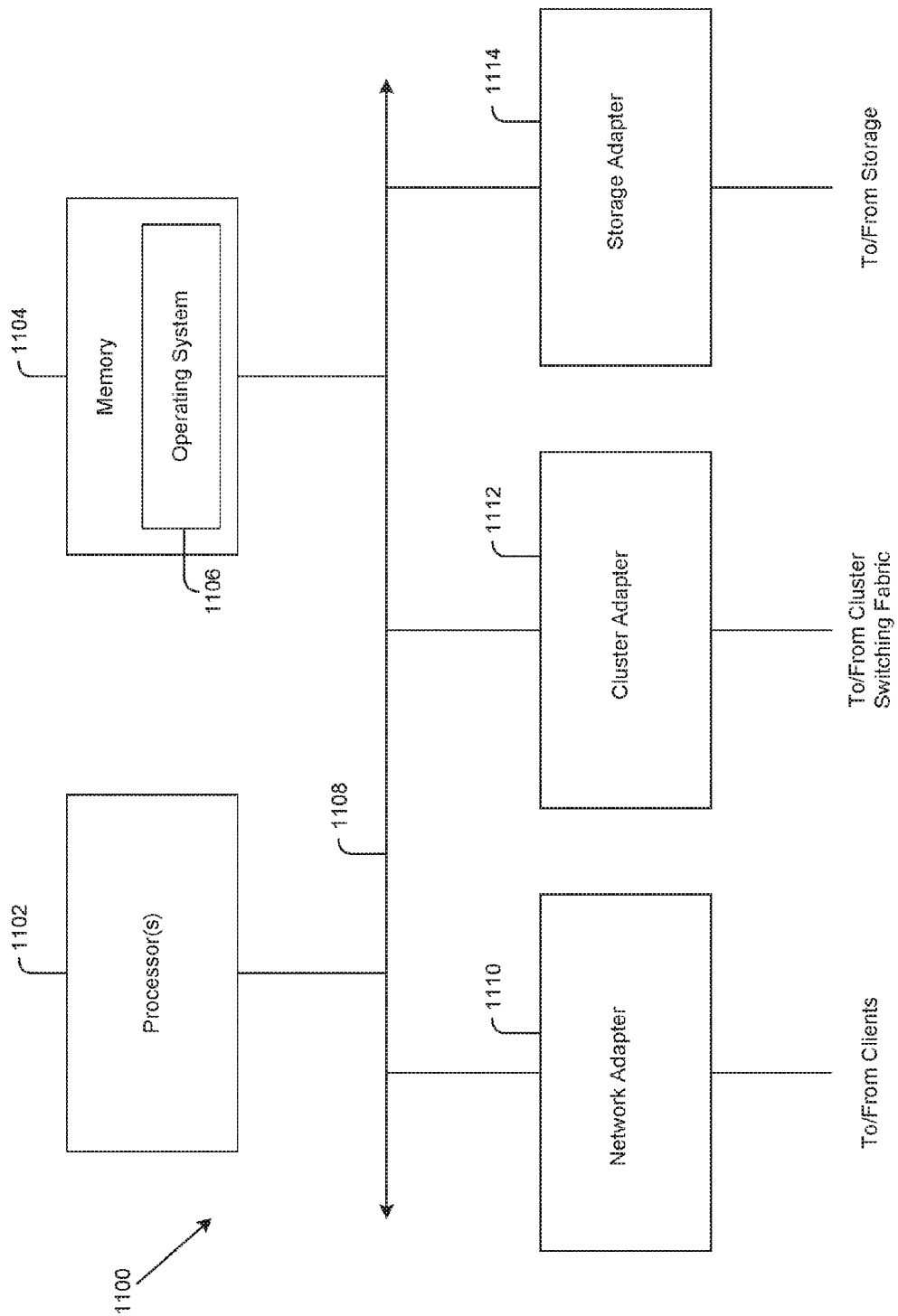
FIG. 11 is a high-level block diagram illustrating an example of a hardware architecture of a computing device that can perform some of the disclosed functionalities.

FIG. 11 is a high-level block diagram illustrating an example of a hardware architecture of a computing device 1100 that can performs functionalities disclosed herein. The computing device 1100 can execute some or all of the processor executable process steps that are described herein. The computing device 1100 can serve as, e.g., the digital processor 120 or a part of the power supply device 100.

In various embodiments, the computing device 1100 includes a processor subsystem that includes one or more processors 1102. Processor 1102 may be or may include, one or more programmable general-purpose or special-purpose microprocessors, digital signal processors (DSPs), programmable controllers, application specific integrated circuits (ASICs), programmable logic devices (PLDs), or the like, or a combination of such hardware based devices.

The computing device 1100 can further include a memory 1104, a network adapter 1110, a cluster access adapter 1112 and a storage adapter 1114, all interconnected by an interconnect 1108. Interconnect 1108 may include, for example, a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (sometimes referred to as "Firewire") or any other data communication system.

The cluster access adapter 1112 includes one or more ports adapted to couple the computing device 1100 to other devices. In the illustrated embodiment, Ethernet can be used as the clustering protocol and interconnect media, although other types of protocols and interconnects may be utilized within the cluster architecture described herein.

The computing device 1100 can be embodied as a single- or multi-processor storage system executing a storage operating system 1106 that can implement a high-level module, e.g., a storage manager, to logically organize the information as a hierarchical structure of named directories, files and special types of files called virtual disks (hereinafter generally "blocks") at the storage devices. The computing device 1100 can further include graphical processing unit(s) for graphical processing tasks or processing non-graphical tasks in parallel.

The memory 1104 can comprise storage locations that are addressable by the processor(s) 1102 and adapters 1110, 1112, and 1114 for storing processor executable code and data structures. The processor 1102 and adapters 1110, 1112, and 1114 may, in turn, comprise processing elements and/or logic circuitry configured to execute the software code and manipulate the data structures. The operating system 1106, portions of which is typically resident in memory and executed by the processors(s) 1102, functionally organizes the computing device 1100 by (among other things) configuring the processor(s) 1102 to invoke. It will be apparent to those skilled in the art that other processing and memory implementations, including various computer readable storage media, may be used for storing and executing program instructions pertaining to the technology.

The memory 1104 can store instructions, e.g., for a body feature module configured to locate multiple part patches from the digital image based on the body feature databases; an artificial neural network module configured to feed the part patches into the deep learning networks to generate multiple sets of feature data; an classification module configured to concatenate the sets of feature data and feed them into the classification engine to determine whether the digital image has the image attribute; and an whole body module configured to processing the whole body portion.

The network adapter 1110 can include multiple ports to couple the computing device 1100 to one or more clients over point-to-point links, wide area networks, virtual private networks implemented over a public network (e.g., the Internet) or a shared local area network. The network adapter 1110 thus can include the mechanical, electrical and signaling circuitry needed to connect the computing device 1100 to the network. Illustratively, the network can be embodied as an Ethernet network or a Fibre Channel (FC) network. A client can communicate with the computing device over the network by exchanging discrete frames or packets of data according to pre-defined protocols, e.g., TCP/IP.

The storage adapter 1114 can cooperate with the storage operating system 1106 to access information requested by a client. The information may be stored on any type of attached array of writable storage media, e.g., magnetic disk or tape, optical disk (e.g., CD-ROM or DVD), flash memory, solid-state disk (SSD), electronic random access memory (RAM), micro-electro mechanical and/or any other similar media adapted to store information, including data and parity information. The storage adapter 1114 can include multiple ports having input/output (I/O) interface circuitry that couples to the disks over an I/O interconnect arrangement, e.g., a conventional high-performance, Fibre Channel (FC) link topology. In various embodiments, the cluster adapter 1112 and the storage adapter 1114 can be implemented as one adaptor configured to connect to a switching fabric, e.g., a storage network switch, in order to communicate with other devices and the mass storage devices.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. A power supply device comprising:
an energy storage circuit configured to temporarily store electric energy for driving a load;
a semiconductor switch configured to turn on and off during pulse-width modulation (PWM) periods,
wherein the semiconductor switch is electrically coupled between the energy storage circuit and an electric source, and
wherein the semiconductor switch turns on once and turns off once during each of the PWM periods; and
a digital pulse-width modulation (PWM) controller configured to generate a driving waveform to regulate on and off status of the semiconductor switch,
wherein the driving waveform toggles a ratio of PWM periods of a first type to PWM periods of a second type to transition from a first power output to a second power output,
wherein the first power output corresponds to the driving waveform being comprised solely of PWM periods of the first type,
wherein the second power output corresponds to the driving waveform being comprised solely of PWM period of the second type,
wherein transitioning from the first power output to the second power output requires that the driving waveform traverse at least one intermediate power output, each intermediate power output corresponding to a different ratio of PWM periods of the first type to PWM periods of the second type,
wherein a count of intermediate power outputs is adjustable such that each intermediate power output corresponds to a fixed percentage of a power differential between the first power output and the second power output, and
wherein a dwell time at each intermediate power output is adjustable such that energy stored in the energy storage circuit stays beneath a predefined level.

2. The power supply device of claim 1, wherein the digital PWM controller operates at a clock rate that determines a minimum time unit for the driving waveform generated by the digital PWM controller, and the driving waveform remaining constant during each minimum time unit.

3. The power supply device of claim 2, wherein a difference between on time of the PWM periods of the first type and on time of the PWM periods of the second time is an integer number of the minimum time unit.

4. The power supply device of claim 2, wherein a difference between off time of the PWM periods of the first type and on time of the PWM periods of the second time is an integer number of the minimum time unit.

5. The power supply device of claim 1, wherein
the at least one intermediate power output includes a third power output, the third power output being lower than the second power output and higher than the first power output.

6. The power supply device of claim 5, wherein the power supply device cannot produce the third power output by generating a driving waveform containing only PWM periods of a third type, because the digital PWM controller cannot generate the PWM periods of the third type due to a minimum time unit limited by a clock rate of the digital PWM controller.

7. The power supply device of claim 1,
wherein a first duty cycle of the PWM periods of the first type is different from a second duty cycle of the PWM periods of the second type, because a difference between switch-on time of the PWM periods of the first type and switch-on time of the PWM periods of the second type is of a minimum time unit; and
wherein the digital PWM controller cannot generate PWM periods having a duty cycle between the first and second duty cycle, because the digital PWM controller cannot change switch-on time by a fraction of the minimum time unit due to a clock rate limitation of the digital PWM controller.

8. The power supply device of claim 7, wherein the PWM periods of the first and second types have the same PWM period time duration.

9. The power supply device of claim 1,
wherein a first duty cycle of the PWM periods of the first type is different from a second duty cycle of the PWM periods of the second type, because a difference between switch-off time of the PWM periods of the first type and switch-off time of the PWM periods of the second type is of a minimum time unit; and
wherein the digital PWM controller cannot generate PWM periods having a duty cycle between the first and second duty cycle, because the digital PWM controller cannot change switch-off time by a fraction of the minimum time unit due to a clock rate limitation of the digital PWM controller.

10. The power supply device of claim 9, wherein the PWM periods of the first type have a PWM period time duration different from another PWM period time duration of the PWM periods of the second type.

11. The power supply device of claim 9, wherein each of the PWM periods of the first and second types has the same switch-on time within each PWM period.

12. The power supply device of claim 1, wherein the first driving waveform includes a non-alternating pattern of PWM periods of the first type and PWM periods of the second type.

13. The power supply device of claim 1, wherein the driving waveform includes consecutive PWM periods of the first type arranged before consecutive PWM periods of the second type.

14. A dimmer system for a light source, comprising:
a signal receiver configured to receive a dimming control signal for transitioning from a first power output level to a second power output level;
an energy storage circuit configured to temporarily store electric energy for driving the light source;
a semiconductor switch configured to turn on and off during pulse-width modulation (PWM) periods, the semiconductor switch electrically coupled between the energy storage circuit and an electric source, the semiconductor switch turning on once and turning off once during each of the PWM periods to adjust power output and voltage being applied to the light source; and
a software-controlled digital pulse-width modulation (PWM) controller configured to generate a driving waveform to regulate on and off status of the semiconductor switch;
wherein the driving waveform toggles between PWM periods of a first type and PWM periods of a second type to transition from a first power output to a second power output,
wherein the first power output corresponds to the driving waveform being comprised solely of PWM periods of the first type,
wherein the second power output corresponds to the driving waveform being comprised solely of PWM periods of the second type,
wherein transitioning from the first power output to the second power output requires that the driving waveform traverse at least one intermediate power output, each intermediate power output corresponding to a different ratio of PWM periods of the first type to PWM periods of the second type, and
wherein a dwell time at each intermediate power output is adjustable such that energy stored in the energy storage circuit stays beneath a predefined level.

15. The dimmer system of claim 14, wherein the driving waveform, which toggles between PWM periods of at least two different types and gradually adjusts the ratio of numbers of the PWM periods of the at least two different types over time, causes the power being applied to the light source to smoothly transition from the first power output to the second power output through a series of multiple finer power outputs between the first and second power output levels.

16. The dimmer system of claim 15, wherein the software-controlled digital PWM controller cannot cause at least one of the multiple finer power outputs by generating a driving waveform containing just PWM periods of a third duty cycle between a first duty cycle corresponding to PWM periods of the first type and a second duty cycle corresponding to PWM periods of the second type, because switch-on times and switch-off time of each PWM period contain integer numbers of minimum time units, the medium time unit is limited by a clock rate of the software-controlled digital PWM controller.

17. The dimmer system of claim 15, wherein the power being applied to the light source transitions smoothly from the first power output to the second power output through a time series of multiple finer power outputs between the first and second power outputs, such that light intensity of the light source transitions smoothly from a light intensity level to another light intensity level and that a human eye cannot notice discrete light intensity levels during the transitioning.

18. A method for a smooth power output transitioning, comprising:
receiving a control signal for transitioning from a first power output level to a second power output level for power supply;
determining whether a software-controlled pulse-width modulation (PWM) controller is capable of causing an intermediate power output level between the first and second power output levels, by generating a driving waveform including just PWM periods of a single type corresponding to a duty cycle value;
in response to a determination that the software-controlled PWM controller cannot generate the driving waveform including just PWM periods of the single type corresponding to the duty cycle value,
generating a driving waveform that toggles between PWM periods of at least two different types based on a single input signal and gradually adjusts a ratio of numbers of the PWM periods of the at least two different types over time,
wherein the driving waveform includes consecutive PWM periods of a first type corresponding to a first frequency arranged before consecutive PWM periods of a second type corresponding to a second frequency; and
applying to a load a time series of power output levels caused by the driving waveform, the time series of power output levels includes multiple intermediate power output levels such that power being applied to the load transitions smoothly from the first power output level to the second power output level through the multiple intermediate power output levels over time,
wherein a dwell time at each intermediate power output level is adjustable such that energy stored in an energy storage circuit stays beneath a predefined level.

19. The method of claim 18, wherein the software-controlled PWM controller cannot generate the driving waveform including just PWM periods of the single type corresponding to the duty cycle value, because the PWM periods with that duty cycle value require that the software-controlled PWM controller generates the PWM periods with a switch-on time or a switch-off time that lasts for a non-integer number of minimum time unit, the minimum time unit is limited by a clock rate of the software-controlled PWM controller.

20. The method of claim 18, further comprising:
determining PWM periods of two different types, wherein the PWM periods of the two different types having two different switch-on times, or switch-off times, or PWM period time durations that last for integer numbers of minimum time units that are limited by a clock rate of the software-controlled PWM controller.

21. The method of claim 18, wherein the software-controlled PWM controller generates the driving waveform that toggles between PWM periods of the at least two different types and gradually adjusts the ratio of numbers of the PWM periods of the at least two different types over time such that a time average value of duty cycles of the PWM periods within a portion of driving waveform is between duty cycles of the PWM periods of the at least two different types, the time average value of the duty cycles of the portion of the driving waveform cause a power output level applied to the load to be a middle level between the first and second power output level.

22. The method of claim 18, wherein the driving waveform toggles between PWM periods of three different types based on the single input signal and gradually adjusts a ratio of numbers of the PWM periods of the three different types over time.

23. A power supply device, comprising:
   an energy storage circuit configured to temporarily store electric energy for driving a load;
   a semiconductor switch configured to turn on and off during pulse-width modulation (PWM) periods, the semiconductor switch being electrically coupled between the energy storage circuit and an electric source; and
   a digital pulse-width modulation (PWM) controller configured to generate a driving waveform to produce a series of power output levels over time,
      wherein the driving waveform is comprised of PWM periods of a first type corresponding to a first frequency, PWM periods of a second type corresponding to a second frequency, or any combination thereof,
   wherein the series of power output levels includes
      a first power output level corresponding to a first ratio of PWM periods of the first type to PWM periods of the second type,
      a second power output level corresponding to a second ratio of PWM periods of the first type to PWM periods of the second type, and
      a third power output level corresponding to a third ratio of PWM periods of the first type to PWM periods of the second type,
   wherein when transitioning from the first power output level to the third power output level, the driving waveform dwells on the second power output level for a specified period of time, and
   wherein the specified period of time is adjustable such that energy stored in the energy storage circuit stays beneath a predefined threshold.

24. The power supply device of claim 23,
   wherein the first power output level and the second power output level are higher than a power output level produced by a driving waveform including only PWM periods of the first type, and
   wherein the first power output level and the second power output levels are lower than a power output level produced by a driving waveform including only PWM periods of the second type.

* * * * *